US006377682B1

(12) United States Patent
Benesty et al.

(10) Patent No.: US 6,377,682 B1
(45) Date of Patent: Apr. 23, 2002

(54) ROBUST ADAPTIVE FILTER FOR USE IN ACOUSTIC AND NETWORK ECHO CANCELLATION

(75) Inventors: Jacob Benesty, Summit; Tomas Fritz Gaensler, Chatham, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/603,652

(22) Filed: Jun. 26, 2000

(51) Int. Cl.[7] .............................................. H04M 9/08
(52) U.S. Cl. ........................... 379/406.01; 379/406.02; 379/406.05; 379/406.06; 379/406.08; 379/406.09; 379/406.03
(58) Field of Search ................................. 379/400–412

(56) References Cited

U.S. PATENT DOCUMENTS

| 5,157,690 A | | 10/1992 | Buttle |
| 5,295,136 A | * | 3/1994 | Ashley et al. .............. 370/32.1 |
| 5,553,014 A | * | 9/1996 | De Leon, II et al. ....... 364/724 |
| 5,631,900 A | * | 5/1997 | McCaslin et al. ........... 370/287 |
| 5,657,384 A | * | 8/1997 | Staudacher et al. ......... 379/388 |
| 5,828,756 A | | 10/1998 | Benesty et al. ............... 381/66 |

FOREIGN PATENT DOCUMENTS

EP 0750395 12/1996 .......... H03H/21/00

OTHER PUBLICATIONS

Vaseghi, S; Advanced Signal Processing and Digital Noise Reduction; 1996, Pub. Wiley & Teubner, Chapter 13.*
Shelukhin et al., "Preliminary filtering in a Kalman filter with a priori uncertainty" *Telecommunications And Radio engineering*, vol. 38/39, No. 9, (1984).
U.S. application No. 09/228,772, Benesty et al., filed Jan. 6, 1999.
U.S. application No. 09/227,327, Benesty et al., filed Jan. 6, 1999.
U.S. application No. 09/395,834, Benesty et al., filed Sep. 14, 1999.
U.S. application No. 09/473,547, Benesty et al., filed Dec. 28, 1999.
M.M. Sondhi, "An Adaptive Echo Canceller" The Bell System Technical Journal, vol. 46, No. 3, Mar. 1967.
D,L. Duttweiler, "A Twelve–Channel Digital Echo Canceler" IEEE Transactions on Communications, vol. Com–26, No. 5, May, 1978.
T. Gansler, S. Gay, M. M. Sondhi, and J. Benesty, "Double-–Talk Robust Fast Converging Algorithms For Network Echo Cancellation", Proc. 1999 IEEE Workshop on Applications of Signal Processing to Audio and Acoustics, New Paltz, New York, pp. 215–218, Oct. 17–20, 1999.
S. A. Kassam and V. Poor, "Robust Techniques For Signal Processing A Surevey," Proc. IEEE, vol. 73, No. 3, pp. 433–481, Mar. 1965.
T. Gansler, J. Benesty, S. Gay, and M. M. Sondhi, "A Robust Proportionate Affine Projection Algorithm For Network Echo Cancellation", Proc. ICASSP vol. II, pp. 793–796, Jun. 2000.

* cited by examiner

*Primary Examiner*—Forester W. Isen
*Assistant Examiner*—Ramnandan Singh
(74) *Attorney, Agent, or Firm*—Ryan, Mason & Lewis, LLP

(57) ABSTRACT

An adaptive filter (and a corresponding adaptive filtering method) for use in an echo cancellation environment, comprising a finite impulse response filter having a vector of adaptive coefficients, and an adaptive coefficient vector update module which modifies the vector of adaptive coefficients in response to an error signal and based on a predetermined probability density function for said error signal. In accordance with several illustrative embodiments of the present invention, the probability density function is advantageously non-Gaussian, and has certain advantageous characteristics which provide for robustness in the adaptive algorithm based thereupon.

30 Claims, 2 Drawing Sheets

ROBUST ADAPTIVE FILTER FOR USE IN ACOUSTIC AND NETWORK ECHO CANCELLATION

FIELD OF THE INVENTION

The present invention relates generally to the field of acoustic and network echo cancellation and more particularly to an improved robust method for performing adaptive filtering therefor.

BACKGROUND OF THE INVENTION

With the increasingly commonplace use of speakerphones and teleconferencing, acoustic echo cancellation has recently become a topic of critical importance. In particular, an acoustic echo canceller (AEC) ideally removes the undesired echoes that result from the coupling between the loudspeaker and the microphone as used in full-duplex hands-free telecommunications systems. FIG. 1 shows a diagram of an illustrative acoustic echo canceller. (In many cases, stereo echo cancellers are used, but in the context of the instant problem and the present invention, the illustrative use of a single-channel teleconferencing system will be adequate.) The components and operation of FIG. 1 will be described in detail below.

In addition, echo cancellation techniques are also employed inside telecommunications (e.g., telephone) networks, because of the imperfect coupling of incoming signals at the 4-to-2 wire junctions in the networks. Unwanted echoes typically result from the fact that the impedance of the 2-wire facility is imperfectly balanced in the 4-to-2 wire junction, causing the incoming signal to be partially reflected over an outgoing path to the source of the incoming signals. Thus, network echo cancellers are used to remove this unwanted echo. FIG. 2 shows a diagram of an illustrative network echo canceller. The components and operation of FIG. 2 will also be described in detail below.

In both of these applications, echo cancellation is typically performed with use of an adaptive filter, fully familiar to those of ordinary skill in the art. In particular, the echo canceller mitigates the echo effect by adjusting the transfer function (i.e., the impulse response characteristic) of the adaptive filter in order to generate an estimate of the unwanted return signal. That is, the filter is adapted to mimic the effective transfer function of the acoustic path from the loudspeaker to the microphone in the acoustic echo cancellation application, or the effective transfer function of the reflection in the network echo cancellation application. As such, by filtering the incoming signal (i.e., the signal coming from the far-end), the output of the filter will estimate the unwanted return signal. Then, this estimate is subtracted from the outgoing signal (i.e., the return signal) to produce an error signal. By adapting the filter impulse response characteristic such that the error signal approaches zero, the echo is advantageously reduced or eliminated. That is, the filter coefficients, and hence the estimate of the unwanted echo, are updated in response to continuously received samples of the error signal for more closely effectuating as complete a cancellation of the echo as possible.

Additionally, double talk detectors (DTD) are generally used in echo cancellers in order to disable the filter adaptation during double talk conditions. That is, when both the near end and the far end party to a conversation talking place across a telecommunications line speak simultaneously, it would be undesirable to attempt to minimize the entire "error signal," since that signal now also includes the "double talk" (i.e., the speech of the near-end speaker). Specifically, the function of a double talk detector is to recognize that double talk is occurring, and to stop the filter from further adaptation until the double talk situation ceases. However, since a double talk detector cannot disable adaptation at the precise instant the double talk begins, a number of samples may occur in the delay periods between the commencement of double talk and the time when the double talk detector actually shuts down adaptation of the filter. And although it is generally advantageous to use a fast converging filter adaptation algorithm so that unwanted echoes and, in particular, changes which occur in the echo characteristics are quickly removed, such fast adaptation implies that samples taken during the aforementioned delay periods (i.e., between the commencement of double talk and the time when the double talk detector successfully shuts down adaptation of the filter) may considerably perturb the echo path estimate.

Thus, although prior art arrangements of adaptive filters for use in echo cancellers perform satisfactorily in most situations, it is often difficult to simultaneously achieve both sufficiently fast adaptation and the ability to resist perturbations caused by samples occurring prior to the cessation of adaptation by a double talk detector. (This ability to resist such perturbations is referred to herein as "robustness.") As such, it would be desirable to provide a more robust filter adaptation algorithm which, while still having the properties of fast convergence, also provides robustness to double talk situations. In co-pending patent application Ser. No. 09/228,772, "Adaptive Filter For Network Echo Cancellation" by J. Benesty et al., it was suggested that certain scaled non-linearities may be advantageously applied to the coefficients of the adaptive filter in the context of a network echo cancellation algorithm, and that such modifications would in certain cases provide such an enhanced robustness. (Co-pending application Ser. No. 09/228,772, which is commonly assigned to the assignee of the present invention, is hereby incorporated by reference as if fully set forth herein.) Although the technique of application Ser. No. 09/228,772 does in fact provide some such added robustness over prior approaches, it would nonetheless be desirable to devise a less ad hoc technique which more completely and successfully addresses the instant problem.

SUMMARY OF THE INVENTION

It has been recognized that a fast converging coefficient adaptation algorithm, such as those commonly employed in adaptive filters used in echo cancellation applications, may be advantageously modified based on a predetermined probability density function for the error signal upon which the adaptation process is based. That is, improved robustness may be achieved when one of certain particular probability density functions for the error signal is both assumed and then explicitly taken into account in the design of the filter adaptation algorithm. In particular, the use of certain advantageously selected non-Gaussian probability density functions has been shown to provide for particularly robust adaptation algorithms.

More specifically then, the present invention provides an adaptive filter (and a corresponding adaptive filtering method) comprising a finite impulse response filter having a vector of adaptive coefficients, and an adaptive coefficient vector update module which modifies the vector of adaptive coefficients in response to an error signal and based on a predetermined probability density function for said error signal. In accordance with certain illustrative embodiments of the present invention, the probability density function is advantageously non-Gaussian, and in particular may comprise either the function $$p_1(z) = \frac{1}{2} e^{-\ln[\cos h(\pi z/2)]}$$

or the function $$p_2(z) = \begin{cases} \frac{1-\varepsilon}{\sqrt{2\pi}} e^{-z^2/2}, & |z| \leq k_0 \\ \frac{1-\varepsilon}{\sqrt{2\pi}} e^{-|z|k_0 + k_0^2/2}, & |z| > k_0 \end{cases}.$$

BRIEF DESCRIPTION OF THE DRAWINGS

FIG. 3 shows a graph illustrative of three probability density functions (PDFs), including the Gaussian PDF and two illustrative non-Gaussian PDFs which may be advantageously employed in certain illustrative embodiments of the present invention.

DETAILED DESCRIPTION

Overview

Figure 1:
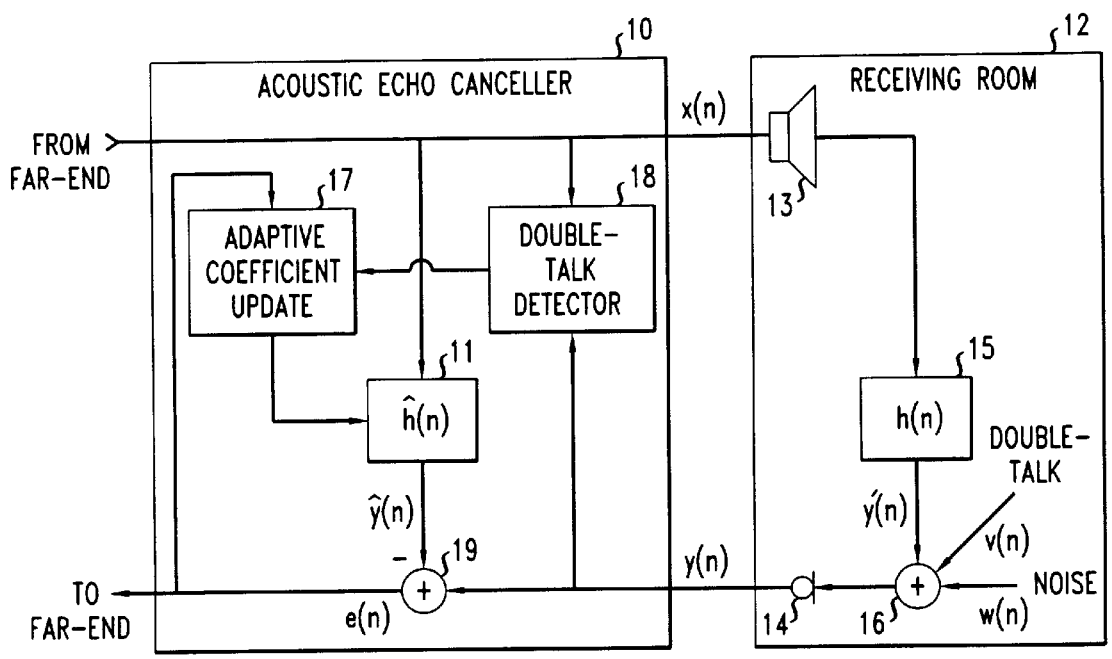
FIG. 1 shows a block diagram of an acoustic echo canceller in accordance with one illustrative embodiment of the present invention.

FIG. 1 shows a block diagram of an acoustic echo canceller in accordance with an illustrative embodiment of the present invention. The environment in which the illustrative echo canceller operates includes (near-end) receiving room 12, which contains a conventional loudspeaker 13 and a conventional microphone 14. Loudspeaker 13 produces an acoustic signal from far-end signal x(n), which comprises speech received from a far-end talker. As a result of the implicit transfer function, h(n), effectuated by the acoustic path(s) through room 12, an echo, y'(n), is produced. Implicit transfer function h(n) is illustratively shown in the figure as filter 15. Note that the transfer function h(n) is likely to change over time, as a result, for example, of movement within the room of either the loudspeaker, the microphone, the occupants, etc. The echo, y'(n), is combined with the room's ambient noise, w(n), and if there is double-talk (i.e., a person in room 12 who is also talking), is also combined with the double-talk, v(n). This implicit combination of signals occurring in room 12 is illustratively shown in the figure as adder 16. The resultant combined signal is then picked up by microphone 14 which generates return signal y(n), which may contain, inter alia, an echo.

Acoustic echo canceller 10 of FIG. 1 comprises (adaptive) filter 11, adaptive coefficient update module 17, double-talk detector 18, and conventional subtractor 19. Filter 11 may be a conventional adaptive finite impulse response (FIR) filter, and may, for example, have a filter length of either 512 or 1024. Double-talk detector (DTD) 18 may also be conventional using, for example, the Geigel DTD technique familiar to those skilled in the art. In accordance with an illustrative embodiment of the present invention, however, adaptive coefficient update module 17 advantageously implements a Fast Recursive Least Squares (FRLS) adaptive algorithm based on a predetermined probability density function as further described below.

In operation, the illustrative acoustic echo canceller of FIG. 1 filters the far-end signal, x(n), to produce an echo estimate signal, ŷ(n), with use of filter 11, the coefficients of which are advantageously continuously adapted in accordance with the illustrative inventive algorithm of adaptive coefficient update module 17. As is conventional, upon the detection of double-talk by double-talk detector 18, the adaptation of the coefficients is advantageously suspended. The echo estimate signal, ŷ(n), is then subtracted from the return signal y(n) by subtractor 19 to generate the error signal, e(n). The error signal serves both as the primary input to adaptive coefficient update module 17 (which signal adaptive coefficient update module 17 attempts to minimize by its continuous updates of the filter coefficients), and as the signal to be returned to the far-end of the telecommunications system.

Figure 2:
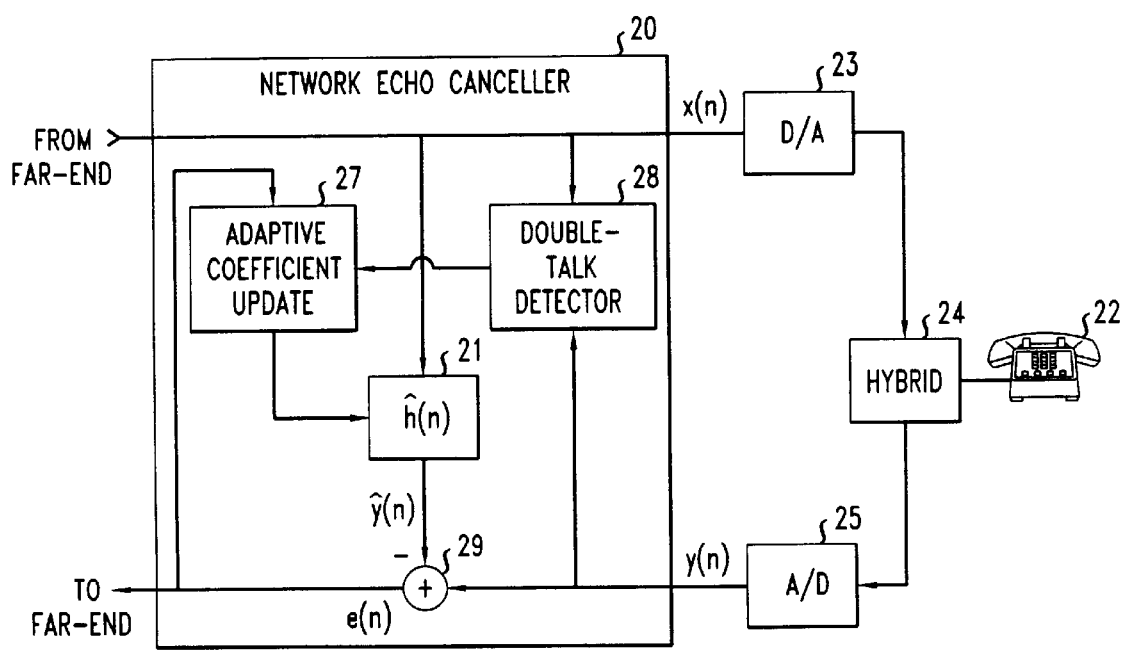
FIG. 2 shows a block diagram of a network echo canceller in accordance with another illustrative embodiment of the present invention.

FIG. 2 shows a block diagram of an illustrative network echo canceller in accordance with an illustrative embodiment of the present invention. The environment in which the illustrative network echo canceller operates comprises conventional telephone set 22, connected to conventional hybrid 24, which is fed by conventional digital-to-analog (D/A) converter 23, and which, in turn, feeds conventional analog-to-digital (A/D) converter 25. D/A 23 is fed by far-end signal x(n), which comprises speech received from a far-end talker. As a result of the imperfect coupling at the 4-2 wire junction (i.e., at hybrid 24), an echo, which may be combined with any ambient noise picked up by telephone 22, and which may further be combined with any double-talk which the user of telephone 22 may produce, is generated. As such, return signal y(n) as generated by A/D 25 may contain, inter alia, an echo.

Network echo canceller 20 of FIG. 2, like acoustic echo canceller 10 of FIG. 1, comprises (adaptive) filter 21, adaptive coefficient update module 27, double-talk detector 28, and conventional subtractor 29. Filter 21 may be a conventional adaptive finite impulse response (FIR) filter, and may, for example, have a filter length of either 512 or 1024. Double-talk detector (DTD) 28 may also be conventional using, for example, the Geigel DTD technique familiar to those skilled in the art. In accordance with an illustrative embodiment of the present invention, however, adaptive coefficient update module 27 advantageously implements a Fast Recursive Least Squares (FRLS) adaptive algorithm based on a predetermined probability density function as further described below.

In operation, the illustrative network echo canceller of FIG. 2, like the illustrative acoustic echo canceller of FIG. 1, filters the far-end signal, x(n), to produce an echo estimate signal, ŷ(n), with use of filter 21, the coefficients of which are advantageously continuously adapted in accordance with the algorithm of adaptive coefficient update module 27. As is conventional, upon the detection of double-talk by double-talk detector 28, the adaptation of the coefficients is advantageously suspended. The echo estimate signal, ŷ(n), is then subtracted from the return signal y(n) by subtractor 29 to generate the error signal, e(n). The error signal serves both as the primary input to adaptive coefficient update module 27 (which signal adaptive coefficient update module 27 attempts to minimize by its continuous updates of the filter coefficients), and as the signal to be returned to the far-end of the telephone network.

The Probability Density Function of the Error Signal

In prior art adaptive filter algorithms, in the context of system identification, the error signal, e(n) (which is by definition the difference between the system and model filter outputs), is implicitly assumed to be zero-mean, white, and Gaussian. That is, the recursive least squares algorithm which is typically employed can be regarded as a maximum likelihood estimator in which the error distribution has been assumed to be Gaussian, and as such, it is asymptotically efficient. While this supposition is very convenient and extremely useful in practice, adaptive algorithms so optimized may be very sensitive to minor deviations from the assumptions.

One good example of system identification with the above assumptions is network echo cancellation (EC) combined with a double-talk detector (DTD). Another example is acoustic echo cancellation (AEC), also combined with a double-talk detector. In both of these cases, the DTD sometimes will fail to detect the beginning or ending of a double-talk mode and as a result, a burst of speech at the output of the echo path will disturb the estimation process. The occurrence rate of these bursts depends on the efficiency of the DTD and the intensity of double-talk modes.

A desirable property of an adaptive algorithm is fast tracking. A high false alarm rate of the DTD reduces the amount of information that enters the algorithm, thereby reducing the tracking rate. False alarms should therefore be advantageously minimized so that valuable data are not discarded. Fewer false alarms however, results in more detection misses and degradation of the transfer function estimate. To maintain tracking ability and high quality of the estimate, in accordance with the principles of the present invention, robustness against detection errors is advantageously incorporated in the estimation algorithm itself. As is familiar to those skilled in the art of statistics, the term "robustness" is used to mean insensitivity to small deviations of the real distribution from the assumed model distribution.

Thus, the performance of an algorithm which is implicitly optimized for Gaussian noise could be limited because of the unexpected number of large noise values that are not modeled by the Gaussian law. In particular and in accordance with the principles of the present invention, in the above-described echo cancellation applications, it would be advantageous if the probability density function (PDF) of the noise which is incorporated into the model were a "long-tailed" PDF, in order to take into account bursts due the failure of the DTD to detect double-talk. Note that we are interested in distributional robustness since the shape of the true underlying distribution deviates slightly from the previously assumed model (i.e., the Gaussian law).

As is well known in the art of statistics, a robust procedure advantageously achieves the following benefits. It has a reasonably good efficiency at the assumed model; it is robust in the sense that small deviations from the model assumptions impair the performance only slightly; and larger deviations from the model do not cause a catastrophe. Thus, in accordance with one illustrative embodiment of the present invention, we advantageously employ the following PDF:

$$p_1(z) = \frac{1}{2}\exp\{-\ln[\cosh(\pi z/2)]\}$$

where the mean and the variance are equal to 0 and 1, respectively. Comparing this PDF to the Gaussian density, $$p_G(z) = \frac{1}{\sqrt{2\pi}}\exp\{-z^2/2\},$$

it can be seen that $p_1(z)$ advantageously has a "heavier" tail than $p_G(z)$. By this we mean that $p_1(z) > p_G(z), \forall |z| \geq |z_0|$. Although the difference between these two PDFs appears to be relatively small, if we take the derivatives of $\ln[p_1(z)]$ and $\ln[p_G(z)]$, respectively, it can easily be determined that the first one is bounded while the second is not—this, as it turns out, advantageously makes all the difference between a robust approach and a non-robust one. Moreover, $p_1(z)$ advantageously has a high kurtosis, and as is well known to those skilled in the art, PDFs with a large kurtosis are good models for speech signals, which turns out to be desirable in the instant context of echo cancellation under double-talk conditions.

In accordance with another illustrative embodiment of the present invention, the following PDF is advantageously employed:

$$p_2(z) = \begin{cases} \frac{1-\varepsilon}{\sqrt{2\pi}}e^{-z^2/2}, & |z| \leq k_0 \\ \frac{1-\varepsilon}{\sqrt{2\pi}}e^{-|z|k_0+k_0^2/2}, & |z| > k_0 \end{cases}.$$

This PDF is known in the statistics art as the PDF of the least informative distribution. Like $p_1(z)$, it also has a mean and a variance equal to 0 and 1, respectively.

The following table provides, for each of the PDFs $p_1(z)$, $p_2(z)$, and $p_G(z)$, the derivative values $\psi(z)$ and $\psi'(z)$, representing the first and second derivatives of the logarithm of the corresponding PDF, respectively. Note that $\theta(z)$ is the Heaviside function, familiar to those of ordinary skill in the art, and defined as:

$\theta(z)=1, z>0, \theta(z)=0, z<0.$

| PDF | $\psi(z)$ | $\psi'(z)$ |
| --- | --- | --- |
| $p_1(z)$ | $\pi\tanh(\frac{\pi}{2}z)/2$ | $\pi^2/4\cosh^2(\frac{\pi}{2}z)$ |
| $p_2(z)$ | $\max\{-k_0 \min(z, k_0)\}$ | $\theta(z+k_0) - \theta(z-k_0)$ |
| $p_G(z)$ | $z$ | $1$ |

Figure 3A:
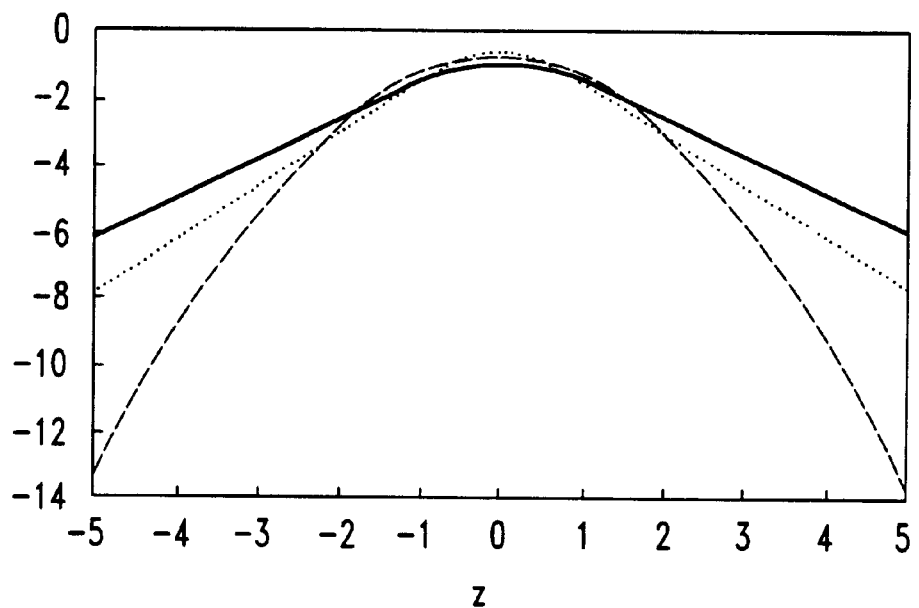
FIG. 3A shows the three PDFs on a logarithmic scale.
Figure 3B:
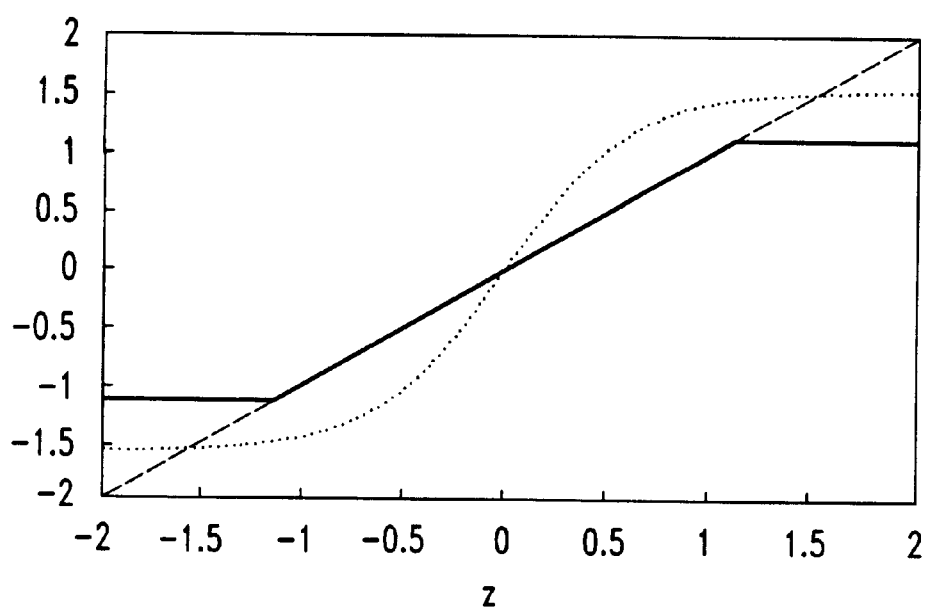
FIG. 3B shows the corresponding first derivatives thereof.

Finally, FIG. 3 shows a graph illustrative of these three PDFs. Specifically, FIG. 3A shows the PDFs on a logarithmic scale and FIG. 3B shows the corresponding first derivatives, $\psi(z)$, thereof. In the graphs, the dashed lines represent $p_G(z)$, the dotted lines represent $p_1(z)$ and the solid lines represent $p_2(z)$.

An Illustrative Adaptive Filter Algorithm Derivation

The following describes the derivation of a robust fast recursive least squares adaptive algorithm in accordance with the principles of the present invention—i.e., based on a predetermined probability density function (PDF)—and its application to the problem of echo cancellation. Specifically and with reference to FIG. 1 and FIG. 2, in the context of echo cancellation the error signal at time n between the system and model filter outputs is given by:

$e(n)=y(n)-\hat{y}(n),$ where $\hat{y}(n)=\hat{h}^T x(n)$ is an estimate of the output signal, $y(n)$, $\hat{h}=[\hat{h}_0 \hat{h}_1 \ldots \hat{h}_{L-1}]^T$ is the model filter, and $x(n)=[x(n) x(n-1) \ldots x(n-L+1)]^T$ is a vector containing the last L samples of the input signal $x(n)$. Note that superscript $^T$ denotes the transpose of a vector or a matrix.

The first step in the derivation of a robust algorithm in accordance with the present invention is to choose an optimization criterion. Consider, for example, the following function:

$$J(\hat{h}) = \rho\left[\frac{e(n)}{s(n)}\right],$$

where $$\rho(z) \sim -\ln[p(z)]$$

is a convex function (i.e., $\rho''(z)>0$), and where s(n) is a positive scale factor more thoroughly described below.

Newton-type algorithms, fully familiar to those of ordinary skill in the art, may be used to minimize the optimization criterion by the following recursion:

$$\hat{h}(n) = \hat{h}(n-1) - R_{104}^{-1} \nabla J[\hat{h}(n-1)],$$

where $\nabla J(\hat{h})$ is the gradient of the optimization criterion with respect to $\hat{h}$, and where $R_{\psi'}$ is an approximation of $E\{\nabla^2 J[\hat{h}(n-1)]\}$. (See below—note that $E\{\}$ denotes mathematical expectation.)

The gradient of $J(\hat{h})$ with respect to $\hat{h}$ is:

$$\nabla J(\hat{h}) = -\frac{x(n)}{s(n)} \psi\left[\frac{e(n)}{s(n)}\right],$$

where $$\frac{d}{dz}\rho(z) = \rho'(z) = \psi(z).$$

The second derivative of $J(\hat{h})$ is:

$$\nabla^2 J(\hat{h}) = \frac{x(n)x^T(n)}{s^2(n)} \psi'\left[\frac{e(n)}{s(n)}\right],$$

where $$\psi'(z) > 0, \forall z.$$

Note that in accordance with certain illustrative embodiments of the present invention, advantageous choices of $\psi(\cdot)$ include in particular those described above in the discussion of illustrative probability density functions (PDFs) for the error signal.

Illustratively, we choose in particular the following approximation of $R_{104}$:

$$R_{\psi'} = \frac{\psi\left[\frac{e(n)}{s(n)}\right]}{s^2(n)} R(n)$$

with $R = E\{x(n)x^T(n)\}$. Since, in practice, R is not known, we advantageously estimate it recursively as follows:

$$R(n) = \sum_{i=1}^{n} \lambda^{n-i} x(i) x^T(i)$$

$$= \lambda R(n-1) + x(n)x^T(n),$$

where $\lambda (0<\lambda \leq 1)$ is an exponential "forgetting" factor. The above choice of $R_{\psi'}$ will advantageously allow us to derive a fast version of the robust algorithm.

Finally, based on the above, an illustrative robust recursive least squares (RLS) adaptive algorithm in accordance with the present invention can be derived as follows:

$$e(n) = y(n) - \hat{h}(n-1)x(n)$$

$$\hat{h}(n) = \hat{h}(n-1) + \frac{s(n)}{\psi'\left[\frac{e(n)}{s(n)}\right]} k(n) \psi\left[\frac{e(n)}{s(n)}\right],$$

where $k(n) = R^{-1}(n)x(n)$ is the Kalman gain, familiar to those skilled in the art.

In accordance with one illustrative embodiment of the present invention, for example, we may advantageously use $p_1(z)$, the first illustrative PDF of the error signal described above:

$$p_1(z) = \frac{1}{2} \exp\{-\ln[\cosh(\pi z/2)]\}.$$

Thus, from above, we have:

$$\rho(z) = \ln[\cos h(z)] = -\ln[2p(2z/\pi)],$$

$$\psi(z) = \tan h(z),$$

and $$\psi'(z) = \frac{1}{\cosh^2(z)} > 0, \forall z.$$

In this case, it can be seen that $0<\psi'(z)\leq 1$, $\forall z$, and $\psi'(z)$ can become very small. In order to avoid divergence of the robust RLS, we advantageously do not allow $\psi'(z)$ to be lower than 0.5. Thus, in accordance with one illustrative embodiment of the present invention, $\psi'(z)$ is computed as above, but is re-initialized to 0.5 if it would otherwise be lower than 0.5. It can be seen that large errors will be advantageously limited by the function $\psi(\cdot)$. Note, however, that if we choose $\rho(z)=z^2$, then $\psi(z)=2(z)$ and $\psi'(z)=2$, and the algorithm becomes the non-robust RLS of the prior art.

Thus, in accordance with one illustrative embodiment of the present invention as described herein, a robust fast RLS (FRLS) can be advantageously derived by using the a priori Kalman gain $k'(n)=R^{-1}(n-1)x(n)$, which can be advantageously computed recursively with 5L multiplications. The error and the adaptation parts can be advantageously computed with 2L multiplications. Note that "stabilized" versions of FRLS (with L additional multiplications) have been described in the literature, but these are not much more stable than their non-stabilized counterparts when used with non-stationary signals such as speech. In accordance with one illustrative embodiment of the present invention, this "problem" can be advantageously and easily fixed by simply re-initializing the predictor-based variables when instability is detected with the use of the maximum likelihood variable which is an inherent variable of the FRLS.

One other important aspect of the illustrative algorithm in accordance with the present invention involves the estimate of the scale factor s(n). Traditionally, a scale factor may be used to make a robust algorithm invariant to the noise level. Advantageously, it reflects the minimum mean square error, is robust to shorter burst disturbances (i.e., double-talk in our application), and tracks longer changes of the residual error (i.e., echo path changes). Therefore, in accordance with one illustrative embodiment of the present invention, the scale factor estimate may be advantageously chosen as:

$$s(n+1) = \lambda_s s(n) + (1-\lambda_s)\frac{s(n)}{\psi\left[\frac{e(n)}{s(n)}\right]}\left|\psi\left[\frac{e(n)}{s(n)}\right]\right|,$$

with $s(0)=\sigma_x$.

Note that this estimate is quite simple to implement, and that the current estimate of s(n) is advantageously governed by the level of the error signal in the immediate past over a time interval roughly equal to $1/(1-\lambda_s)$. When the algorithm has not yet converged, s(n) is large. Hence the limiter is operating in the portion of its curve around the origin, and therefore the robust algorithm behaves roughly like the conventional RLS algorithm. When double-talk occurs, the error is determined by the limiter and by the scale of the error signal during the recent past of the error signal before the double-talk occurred. Thus the divergence rate is reduced for a duration of about $1/(1-\lambda_s)$. This gives ample time for the DTD to act. If there is a system change, the algorithm will not track immediately—however, as the scale estimator tracks the larger error signal the nonlinearity is scaled up and the convergence rate accelerates. The trade off between robustness and the tracking rate of the adaptive algorithm is thus governed by the tracking rate of the scale estimator which is controlled by one single parameter $\lambda_s$. In accordance with one illustrative embodiment of the present invention, $\lambda_s$=0.992, $\lambda$=1−1/(3L) where L is the filter length (e.g, 512 or 1024), and s(n) is computed as described above but is advantageously limited so that it is never allowed to be lower than 0.01.

An Illustrative Robust Fast Recursive Least Squares Algorithm

The following provides a set of specific detailed equations for implementing one illustrative embodiment of an adaptive algorithm in accordance with the present invention. Note in particular that the complexity of this algorithm is O(7L):

Prediction:

$$e_a(n) = x(n) - a^T(n-1)x(n-1)$$

$$\phi_1(n) = \phi(n-1) + e_a^2(n)/E_a(n-1)$$

$$\begin{bmatrix} t(n) \\ m(n) \end{bmatrix} = \begin{bmatrix} 0 \\ k'(n-1) \end{bmatrix} + \begin{bmatrix} 1 \\ -a(n-1) \end{bmatrix} e_a(n)/E_a(n-1)$$

$$E_a(n) = \lambda[E_a(n-1) + e_a^2(n)/\varphi(n-1)]$$

$$a(n) = a(n-1) + k'(n-1)e_a(n)/\phi(n-1)$$

$$e_b(n) = E_b(n-1)m(n)$$

$$k'(n) = t(n) + b(n-1)m(n)$$

$$\phi(n) = \phi_1(n) - e_b(n)m(n)$$

$$E_b(n) = \lambda[E_b(n-1) + e_b^2(n)/\varphi(n)]$$

$$b(n) = b(n-1) + k'(n)e_b(n)/\phi(n)$$

Filtering:

$$e(n) = y(n) - \hat{h}^T(n-1)x(n)$$

$$\psi\left[\frac{e(n)}{s(n)}\right] = \tanh\left[\frac{e(n)}{s(n)}\right]$$

$$\psi'\left[\frac{e(n)}{s(n)}\right] = 1/\cosh^2\left[\frac{e(n)}{s(n)}\right]$$

$$\psi'_f\left[\frac{e(n)}{s(n)}\right] = \begin{cases} \psi'\left[\frac{e(n)}{s(n)}\right] & \text{if } \psi'\left[\frac{e(n)}{s(n)}\right] \geq 0.5 \\ 0.5 & \text{otherwise} \end{cases}$$

$$\hat{h}(n) = \hat{h}(n-1) + \frac{s(n)}{\psi_f\left[\frac{e(n)}{s(n)}\right]\varphi(n)} k'(n)\psi\left[\frac{e(n)}{s(n)}\right]$$

$$s(n+1) = \lambda_s s(n) + (1-\lambda_s)\frac{s(n)}{\psi'_f\left[\frac{e(n)}{s(n)}\right]}\left|\psi\left[\frac{e(n)}{s(n)}\right]\right|$$

Addendum to the Detailed Description

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future—i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the figures, including functional blocks labeled as "processors" or "modules" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the Figs. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, (a) a combination of circuit elements which performs that function or (b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent (within the meaning of that term as used in 35 U.S.C. 112, paragraph 6) to those explicitly shown and described herein.

What is claimed is:

1. An adaptive filter comprising:

a finite impulse response filter comprising a vector of adaptive coefficients; and an adaptive coefficient vector update module which modifies said vector of adaptive coefficients in response to an error signal and based on a predetermined probability density function for said error signal.

2. The adaptive filter of claim 1 wherein the predetermined probability density function is non-Gaussian.

3. The adaptive filter of claim 2 wherein the predetermined probability density function comprises the function:

$$p_1(z) = \frac{1}{2} e^{-\ln[\cosh(\pi z/2)]}.$$

4. The adaptive filter of claim 2 wherein the predetermined probability density function comprises the function:

$$p_2(z) = \begin{cases} \frac{1-\varepsilon}{\sqrt{2\pi}} e^{-z^2/2}, & |z| \le k_0 \\ \frac{1-\varepsilon}{\sqrt{2\pi}} e^{-|z|k_0 + k_0^2/2}, & |z| > k_0 \end{cases}.$$

5. The adaptive filter of claim 1 wherein said adaptive coefficient vector update module modifies said vector of adaptive coefficients with use of a fast converging adaptive algorithm.

6. The adaptive filter of claim 5 wherein said fast converging adaptive algorithm comprises a Fast Recursive Least Squares (FRLS) algorithm.

7. A method for performing adaptive filtering on a given signal, the method comprising the steps of:

filtering said given signal with use of a finite impulse response filter comprising a vector of adaptive coefficients; and modifying said vector of adaptive coefficients in response to an error signal and based on a predetermined probability density function for said error signal.

8. The method of claim 7 wherein the predetermined probability density function is non-Gaussian.

9. The method of claim 8 wherein the predetermined probability density function comprises the function:

$$p_1(z) = \frac{1}{2} e^{-\ln[\cosh(\pi z/2)]}.$$

10. The method of claim 8 wherein the predetermined probability density function comprises the function:

$$p_2(z) = \begin{cases} \frac{1-\varepsilon}{\sqrt{2\pi}} e^{-z^2/2}, & |z| \le k_0 \\ \frac{1-\varepsilon}{\sqrt{2\pi}} e^{-|z|k_0 + k_0^2/2}, & |z| > k_0 \end{cases}.$$

11. The method of claim 7 wherein said step of modifying includes the use of a fast converging adaptive algorithm.

12. The method of claim 11 wherein said fast converging adaptive algorithm comprises a Fast Recursive Least Squares (FRLS) algorithm.

13. An echo canceller for reducing unwanted echo comprised in a near-end return signal in a telecommunications environment the echo canceller comprising:

a finite impulse response filter comprising a vector of adaptive coefficients, the finite impulse response filter being applied to a far-end source signal;

a subtractor which computes an error signal based on a difference between the filtered far-end source signal and the near-end return signal; and an adaptive coefficient vector update module which modifies said vector of adaptive coefficients in response to the error signal and based on a predetermined probability density function for said error signal.

14. The echo canceller of claim 13 wherein the predetermined probability density function is non-Gaussian.

15. The echo canceller of claim 14 wherein the predetermined probability density function comprises the function:

$$p_1(z) = \frac{1}{2} e^{-\ln[\cosh(\pi z/2)]}.$$

16. The echo canceller of claim 14 wherein the predetermined probability density function comprises the function:

$$p_2(z) = \begin{cases} \frac{1-\varepsilon}{\sqrt{2\pi}} e^{-z^2/2}, & |z| \le k_0 \\ \frac{1-\varepsilon}{\sqrt{2\pi}} e^{-|z|k_0 + k_0^2/2}, & |z| > k_0 \end{cases}.$$

17. The echo canceller of claim 13 wherein said adaptive coefficient vector update module modifies said vector of adaptive coefficients with use of a fast converging adaptive algorithm.

18. The echo canceller of claim 17 wherein said fast converging adaptive algorithm comprises a Fast Recursive Least Squares (FRLS) algorithm.

19. The echo canceller of claim 13 further comprising a double talk detector for disabling said adaptive coefficient vector update module in response to a detection of double talk in said telecommunications environment.

20. The echo canceller of claim 13 wherein said echo canceller comprises an acoustic echo canceller for reducing echoes which result from a physical acoustic environment.

21. The echo canceller of claim 13 wherein said echo canceller comprises a network echo canceller for reducing echoes which are generated within a telecommunications network.

22. A method for performing echo cancellation to reduce unwanted echo comprised in a near-end return signal in a telecommunications environment, the method comprising the steps of:

filtering a far-end source signal with use of a finite impulse response filter comprising a vector of adaptive coefficients;

determining an error signal based on a difference between the filtered far-end source signal and the near-end return signal; and modifying said vector of adaptive coefficients in response to the error signal and based on a predetermined probability density function for said error signal.

23. The method of claim 22 wherein the predetermined probability density function is non-Gaussian.

24. The method of claim 23 wherein the predetermined probability density function comprises the function:

$$p_1(z) = \frac{1}{2} e^{-\ln[\cosh(\pi z/2)]}.$$

25. The method of claim 23 wherein the predetermined probability density function comprises the function:

$$p_2(z) = \begin{cases} \frac{1-\varepsilon}{\sqrt{2\pi}} e^{-z^2/2}, & |z| \leq k_0 \\ \frac{1-\varepsilon}{\sqrt{2\pi}} e^{-|z|k_0 + k_0^2/2}, & |z| > k_0 \end{cases}.$$

26. The method of claim 22 wherein said step of modifying includes the use of a fast converging adaptive algorithm.

27. The method of claim 26 wherein said fast converging adaptive algorithm comprises a Fast Recursive Least Squares (FRLS) algorithm.

28. The method of claim 22 further comprising the step of disabling said adaptive coefficient vector update module in response to a detection of double talk in said telecommunications environment.

29. The method of claim 22 wherein said method performs acoustic echo cancellation for reducing echoes which result from a physical acoustic environment.

30. The method of claim 22 wherein said method performs network echo cancellation for reducing echoes which are generated within a telecommunications network.

* * * * *